(12) United States Patent
Liu et al.

(10) Patent No.: US 12,317,644 B2
(45) Date of Patent: May 27, 2025

(54) EPITAXIAL SUBSTRATE STRUCTURE, LIGHT EMITTING DIODE CHIP INCLUDING THE SAME, AND MANUFACTURING METHODS THEREOF

(71) Applicant: XIAMEN SAN'AN OPTOELECTRONICS CO., LTD., Xiamen (CN)

(72) Inventors: Jianming Liu, Xiamen (CN); Taiying Shen, Xiamen (CN); Shutao Liao, Xiamen (CN); Zhenchao Lin, Xiamen (CN); Bing-Yang Chen, Xiamen (CN); Chung-Ying Chang, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 425 days.

(21) Appl. No.: 17/724,829

(22) Filed: Apr. 20, 2022

(65) Prior Publication Data
US 2022/0344538 A1 Oct. 27, 2022

(30) Foreign Application Priority Data
Apr. 23, 2021 (CN) .......... 202110443455.0

(51) Int. Cl.
*H10H 20/82* (2025.01)
*H10H 20/01* (2025.01)
(Continued)

(52) U.S. Cl.
CPC ...... *H10H 20/82* (2025.01); *H10H 20/01335* (2025.01); *H10H 20/815* (2025.01); *H10H 20/825* (2025.01)

(58) Field of Classification Search
CPC ....... H01L 33/22; H01L 33/007; H01L 33/12; H01L 33/32; H10H 20/815; H10H 20/82;
(Continued)

(56) References Cited

U.S. PATENT DOCUMENTS

| 2006/0027820 A1* | 2/2006 | Cao | ............... H01L 33/382 257/89 |
| 2006/0273336 A1* | 12/2006 | Fujikura | ........... H10H 20/833 257/E33.068 |

(Continued)

FOREIGN PATENT DOCUMENTS

| CN | 107075729 A | 8/2017 |
| CN | 107546302 A | 1/2018 |

OTHER PUBLICATIONS

Search Report appended to an Office Action, which was issued to Chinese counterpart application No. 202110443455.0 by the CNIPA on Feb. 23, 2022 with an English translation thereof.

*Primary Examiner* — Mohsen Ahmadi

(57) ABSTRACT

An epitaxial substrate structure includes: a patterned substrate unit including a substrate having a top surface and spaced-apart protrusions formed thereon; and a buffer layer disposed on the top surface and the protrusions. Each of the protrusions has a bottom adjacent to the top surface, and a top opposite to the bottom. The buffer layer has a first portion disposed on the top surface, and second portions respectively disposed on the protrusions. Each of the second portions of the buffer layer has a thickness that gradually reduces from the bottom to the top along a respective one of the protrusions. An LED chip including the epitaxial substrate structure and manufacturing methods of the epitaxial substrate structure and the LED chip are also provided.

7 Claims, 4 Drawing Sheets

(51) Int. Cl.
*H10H 20/815* (2025.01)
*H10H 20/825* (2025.01)

(58) Field of Classification Search
CPC . H10H 20/01335; H10H 20/825; H10H 20/01
See application file for complete search history.

(56) References Cited

U.S. PATENT DOCUMENTS

| | | | | |
|---|---|---|---|---|
| 2010/0096657 A1* | 4/2010 | Ou | ............... | H10H 20/824 257/E33.074 |
| 2011/0284895 A1* | 11/2011 | Hsu | ............... | H01L 33/20 257/E33.074 |
| 2012/0295377 A1* | 11/2012 | Sato | ............... | H10H 20/018 257/E33.072 |
| 2013/0221388 A1* | 8/2013 | Tanaka | ............... | H10H 20/812 430/5 |
| 2013/0264603 A1* | 10/2013 | Lin | ............... | H01L 33/385 257/99 |
| 2015/0171279 A1* | 6/2015 | Lee | ............... | H01L 33/32 428/156 |
| 2015/0311388 A1* | 10/2015 | Shimooka | ............... | H10H 20/825 438/479 |
| 2015/0340558 A1* | 11/2015 | Lee | ............... | H10H 20/833 257/13 |
| 2017/0108173 A1* | 4/2017 | Kim | ............... | H01L 33/0033 |
| 2017/0345971 A1* | 11/2017 | Ide | ............... | H10H 20/812 |
| 2019/0067512 A1* | 2/2019 | Okuno | ............... | H01L 21/02661 |
| 2019/0334059 A1* | 10/2019 | Chen | ............... | H10H 20/82 |
| 2020/0219715 A1* | 7/2020 | Chen | ............... | H01L 21/02002 |
| 2020/0255978 A1* | 8/2020 | Fujikura | ............... | C30B 25/186 |
| 2022/0199860 A1* | 6/2022 | Lin | ............... | C23C 14/568 |
| 2023/0253526 A1* | 8/2023 | Ishimaru | ............... | H10H 20/815 257/79 |

\* cited by examiner

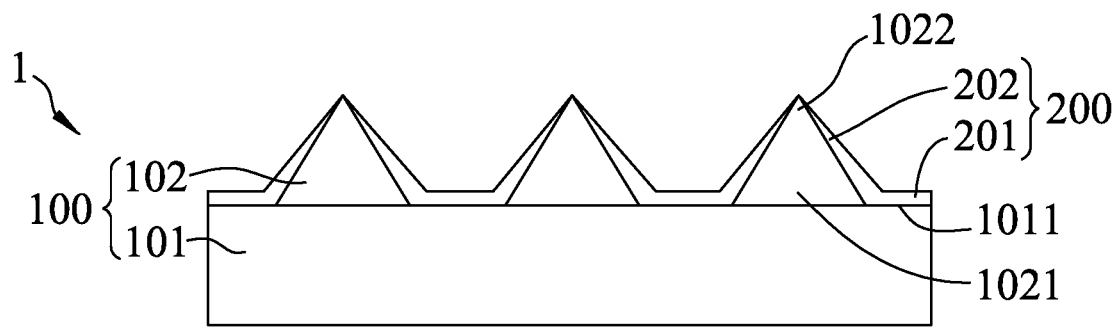

FIG.1

```
┌─────────────────────────────────────┐
│ forming a plurality of spaced-apart │
│ protrusions on a top surface of a   │──S101
│ substrate to form a patterned       │
│ substrate unit                      │
└─────────────────────────────────────┘
                  │
                  ▼
┌─────────────────────────────────────┐
│ forming a buffer layer with a first │
│ portion on the top surface of the   │
│ substrate and second portions on    │
│ the protrusions, each of the second │──S102
│ portions having a thickness that    │
│ gradually reduces from a bottom to  │
│ a top of a respective one of the    │
│ protrusions                         │
└─────────────────────────────────────┘
```

FIG.2

EPITAXIAL SUBSTRATE STRUCTURE, LIGHT EMITTING DIODE CHIP INCLUDING THE SAME, AND MANUFACTURING METHODS THEREOF

CROSS-REFERENCE TO RELATED APPLICATION

This application claims priority of Chinese Invention Patent Application No. 202110443455.0, filed on Apr. 23, 2021. The entire content of the Chinese patent application is incorporated herein by reference.

FIELD

The disclosure relates to a semiconductor device, and more particularly to an epitaxial substrate structure, a light emitting diode chip including the same, and manufacturing methods of the epitaxial substrate structure and the light emitting diode chip.

BACKGROUND

In a light emitting diode (LED) chip, a gallium nitride (GaN)-based epitaxial layered structure is usually grown on a substrate made of silicon carbide (SiC), sapphire or silicon (Si) to form a heterostructure. In such a heterostructure, lattice mismatch and differences in coefficients of thermal expansion (CTE) may exist at an interface between the GaN-based epitaxial layered structure and the substrate. Moreover, Ga diffusion that occurs on the substrate may cause melt-back etching. As stated, there has always been a problem of how to effectively grow the GaN-based epitaxial layered structure on the substrate without destroying the heterostructure.

To solve these problems, a low-temperature aluminum nitride (AlN) interposing layer, a graded aluminum gallium nitride (AlGaN) buffer layer or a supper-lattice buffer layer is usually formed between the GaN-based epitaxial layered structure and the substrate. Generally, when a buffer layer is formed on a substrate, in this case a patterned substrate having a plurality of protrusions to diminish the lattice mismatch and the CTE differences, the buffer layer thus formed has a uniform thickness. However, forming the GaN-based epitaxial layer on the buffer layer with the uniform thickness may induce large strain at an interface between the GaN-based epitaxial layered structure and the buffer layer formed on sidewalls of the protrusions of the patterned substrate, thereby generating warpage in the GaN-based epitaxial layered structure, which may reduce the quality and the wavelength uniformity of the LED chip made therefrom.

SUMMARY

Therefore, an object of the disclosure is to provide an epitaxial substrate structure, a light emitting diode chip including the same, and manufacturing methods of the epitaxial substrate structure and the light emitting diode chip that can alleviate at least one of the drawbacks of the prior art.

According to a first aspect of the disclosure, an epitaxial substrate structure for a light emitting diode chip includes a patterned substrate unit and a buffer layer disposed on the patterned substrate unit. The patterned substrate unit includes a substrate having a top surface, and a plurality of spaced-apart protrusions formed on the top surface of the substrate to expose a portion of the top surface from the protrusions. Each of the protrusions has a bottom adjacent to the top surface of the substrate, and a top opposite to the bottom and away from the substrate. The buffer layer has a first portion disposed on the exposed portion of the top surface of the substrate, and a plurality of second portions respectively disposed on the protrusions. Each of the second portions of the buffer layer has a thickness that gradually reduces along a respective one of the protrusions from the bottom to the top.

According to a second aspect of the disclosure, a light emitting diode chip includes the aforementioned epitaxial substrate structure and an epitaxial layered structure. The epitaxial layered structure includes a first semiconductor layer, an active layer and a second semiconductor layer which are disposed on the buffer layer in such order.

According to a third aspect of the disclosure, a method of manufacturing an epitaxial substrate structure includes the steps of:
(a) forming a plurality of spaced-apart protrusions on a top surface of a substrate to form a patterned substrate unit and expose a portion of the top surface from the protrusions, each of the protrusions having a bottom connected to the top surface of the substrate and a top opposite to the bottom and away from the substrate; and
(b) forming a buffer layer on the patterned substrate unit, the buffer layer having a first portion disposed on the exposed portion of the top surface of the substrate and a plurality of second portions respectively disposed on the protrusions, each of the second portions of the buffer layer has a thickness that gradually reduces along a respective one of the protrusions from the bottom to the top.

According to a fourth aspect of the disclosure, a method of manufacturing a light emitting diode chip includes the steps of the method of the third aspect of the disclosure and the following step: forming an epitaxial layered structure including a first semiconductor layer, an active layer and a second semiconductor layer in such order on the buffer layer.

BRIEF DESCRIPTION OF THE DRAWINGS

Other features and advantages of the disclosure will become apparent in the following detailed description of the embodiments with reference to the accompanying drawings, of which:

FIG. 1 is a schematic view illustrating an embodiment of an epitaxial substrate structure according to the disclosure;

FIG. 2 is a flow chart illustrating an embodiment of a method for manufacturing the embodiment of the epitaxial substrate structure of FIG. 1;

DETAILED DESCRIPTION

Figure 3:
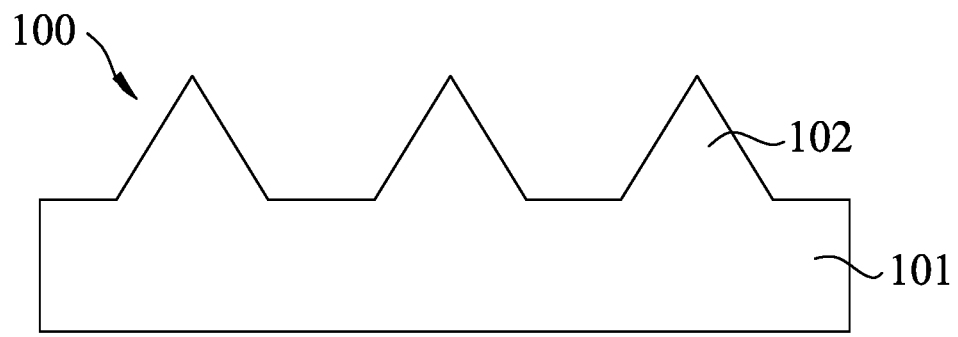
FIG. 3 is a schematic view illustrating a first example of a patterned substrate unit applicable in the embodiment of the epitaxial substrate structure according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of an epitaxial substrate structure 1 for a light emitting diode (LED) chip is illustrated. The epitaxial substrate structure 1 includes a patterned substrate unit 100 and a buffer layer 200 disposed on the patterned substrate unit 100. The patterned substrate unit 100 includes a substrate 101 having a top surface 1011, and a plurality of spaced-apart protrusions 102 formed on the top surface 1011 of the substrate 101 to expose a portion of the top surface 1011 from the protrusions 102. The substrate 101 and the protrusions 102 may be made of the same material or different materials. In the former case, both the substrate 101 and the protrusions may be made of a material selected from the group consisting of sapphire, silicon carbide (SiC), silicon (Si) and zinc oxide (ZnO). In the latter case, the substrate 101 may be made of a material selected from the group consisting of sapphire, silicon carbide (SiC), silicon (Si) and zinc oxide (ZnO), and the protrusions (102) may be made of a material selected from the group consisting of sapphire, silicon carbide (SiC), silicon (Si), zinc oxide (ZnO), silicon dioxide ($SiO_2$), silicon nitride (SiN), silicon monoxide (SiO) and combinations thereof.

Each of the protrusions 102 has a bottom 1021 adjacent to the top surface 1011 of the substrate 101 and a top 1022 opposite to the bottom 1021 and away from the substrate 101. Each of the protrusions 102 tapers from the bottom 1021 to the top 1022. Each of the protrusions 102 may have the shape of a polygonal pyramid, a frustum of a polygonal prism, or a cone. In this embodiment, each of the protrusions 102 has a conical shape.

The buffer layer 200 has a first portion 201 disposed on the exposed portion of the top surface 1011 of the substrate 101 and a plurality of second portions 202 respectively disposed on the protrusions 102. The first portion 201 and the second portions 202 cooperatively form a continuous structure. In this embodiment, the buffer layer 200 is made of aluminum nitride (AlN).

In order to decrease the strain induced in the interface between the buffer layer 200 and the epitaxial layered structure formed thereon, each of the second portions 202 of the buffer layer 200 has a thickness that gradually reduces along a respective one of the protrusions 102 from the bottom 1021 to the top 1022. In a circumstance that each of the second portions 202 of the buffer layer 200 has a uniform thickness along the respective protrusion 102, since the tip and its perimeter of the top 1022 of the respective protrusion 102 is a transition region for epitaxial growth of the epitaxial layered structure, which is not only between two-dimensional and three-dimensional growth regions but also between discontinuous and continuous regions, a large amount of surface energy may be converted into strain and grain boundary energy during fabrication of the epitaxial layered structure on the buffer layer 200, thereby generating defects in the epitaxial layered structure. In this embodiment, since each of the second portions 202 of the buffer layer 200 at the tip of the top 1022 of the respective protrusion 102 has a thickness much smaller than that at the bottom 1021, or the thickness may even approximate zero, a great amount of strain can be released and the quality of the epitaxial layered structure grown on the buffer layer 200 can be also greatly improved. If the thickness of the buffer layer 200 is too thin, the surface of the buffer layer 200 tends to be less dense and rough and cannot provide a required base for the growth of the epitaxial layered structure. On the other hand, if the thickness of the buffer layer 200 is too thick, the surface of the buffer layer 200 tends to be too dense to reduce crystal defects, which is detrimental to the quality of the epitaxial layered structure thus formed. Therefore, in this embodiment, the thickness of the first portion 201 and each of the second portions 202 of the buffer layer 200 are suitably controlled, i.e., the thickness of the first portion 201 of the buffer layer 200 ranges from 10 Å to 2000 Å, and the thickness of each of the second portions 202 of the buffer layer 200 ranges from 0 Å to 2000 Å, for example, greater than 0 Å and smaller than 2000 Å. In one example, the thickness of the first portion 201 of the buffer layer 200 may be controlled to be greater than 50 Å and smaller than 2000 Å. In other words, by virtue of controlling the thickness variation of the buffer layer 200, lattice defects that may form in the epitaxial layered structure can be greatly reduced.

Referring to FIG. 2, a flow chart illustrating an embodiment of a method for manufacturing the epitaxial substrate structure 1 of FIG. 1 is shown. The method includes steps S101 and S102. In step S101, the plurality of spaced-apart protrusions 102 are formed on the top surface 1011 of the substrate 101 to form the patterned substrate unit 100 with the exposed portion of the top surface 1011 from the protrusions 102.

Figure 4:
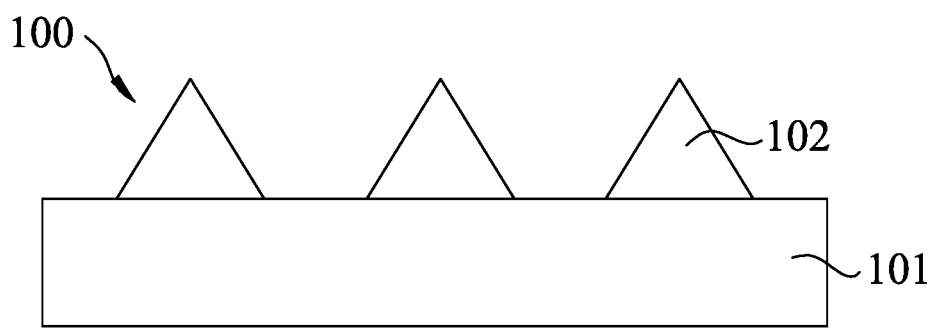
FIG. 4 is a schematic view illustrating a second example of a patterned substrate unit applicable in the embodiment of the epitaxial substrate structure according to the disclosure.

Different examples of the structure of the patterned substrate unit 100 obtained from step S101 are shown in FIGS. 3 and 4, respectively. FIG. 3 illustrates the patterned substrate unit 100 including the substrate 101 and the protrusions 102 made of the same material, such as sapphire. In this embodiment, the protrusions 102 are formed by etching the top surface 1011 of the substrate 101.

FIG. 4 illustrates the patterned substrate unit 100 including the substrate 101 and the protrusions 102 made of different materials. In this embodiment, a protrusion material layer is deposited on the top surface 1011 of the substrate 101 and then the protrusion material layer is etched to form the protrusions 102 on the substrate 101.

Each of the patterned substrate units 100 shown in FIGS. 3 and 4 has the protrusions 102 tapering from the bottom 1021 to the top 1022, and each of the protrusions 102 has the conical shape. For convenience of description, this embodiment of the method takes the patterned substrate unit 100 shown in FIG. 4 as an example for description. It should be noted that the patterned substrate unit 100 shown in FIG. 3 can be used in the step described below.

In step S102, the buffer layer 200 is formed on the patterned substrate unit 100 where the first portion 201 of the buffer layer 200 is disposed on the exposed portion of the top surface 1011 of the substrate 101 and the second portions 202 are respectively disposed on the protrusions 102. As mentioned above, each of the second portions 202 of the buffer layer 200 has a thickness that gradually reduces along the respective protrusions 102 from the bottom 1021 to the top 1022.

The buffer layer 200 is deposited on the patterned substrate unit 100 by physical vapor deposition (PVD), which includes, but not limited to, sputter deposition. In this embodiment, the deposition of the buffer layer 200 is performed by sputtering. The reduction of the thickness of each of the second portions 202 of the buffer layer 200 along the respective protrusion 102 from the bottom 1021 to the top 1022 is performed by controlling a growth pressure, a radio frequency (RF) power and an atomic composition of the buffer layer 200.

The growth pressure may be adjusted by controlling the amount of nitrogen or argon gas flowing into a sputtering chamber or controlling opening size and angle of the gauge valve in the sputtering system. In one example, the growth pressure of the buffer layer 200 is in a range from 0.3 mtorr to 100 mtorr. Control of the RF power may be realized by controlling the directions of target atoms generated from a target in the sputtering chamber and the amount of the target atoms impinging toward the patterned substrate unit 100 from various directions, thereby controlling the thickness of the buffer layer 200 resulting from deposition of the target atoms. In one example, the RF power is in a range from 1000 W to 15000 W. In this embodiment, the buffer layer 200 made of AlN has the atomic composition of Al:N=x:(1−x), where x is in a range from 0.1 to 1.

Figure 5:
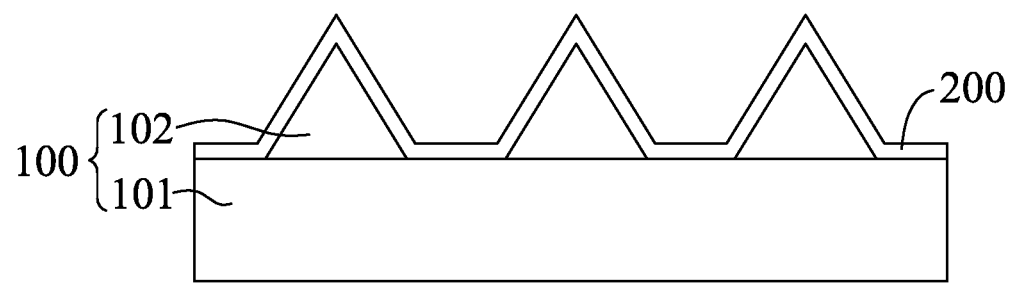
FIG. 5 is a schematic view illustrating that a buffer layer formed on the second example of the patterned substrate unit of FIG. 4.

Furthermore, in step 102, the buffer layer 200 having a uniform thickness is firstly formed on the exposed portion of the top surface 1011 and the substrate 101 and the protrusions 102 by PVD (as shown in FIG. 5). Then, the buffer layer 200 is etched such that the thickness of each of the second portions 202 of the buffer layer 200 is gradually reduced along the respective protrusions 102 from the bottom 1021 to the top 1022 (as shown in FIG. 1).

To be specific, the buffer layer 200 made of AlN is etched by argon (Ar) or nitrogen (N) ions which impinge on the surface of the patterned substrate unit 100. Due to differences in the etching selectivity of the ions relative to the surface of the buffer layer 200, angles at which the ions collide with the surface of the buffer layer 200 may be different, and the second portions 202 of the buffer layer 200 with the above mentioned gradually reduced thickness is obtained.

Figure 6:
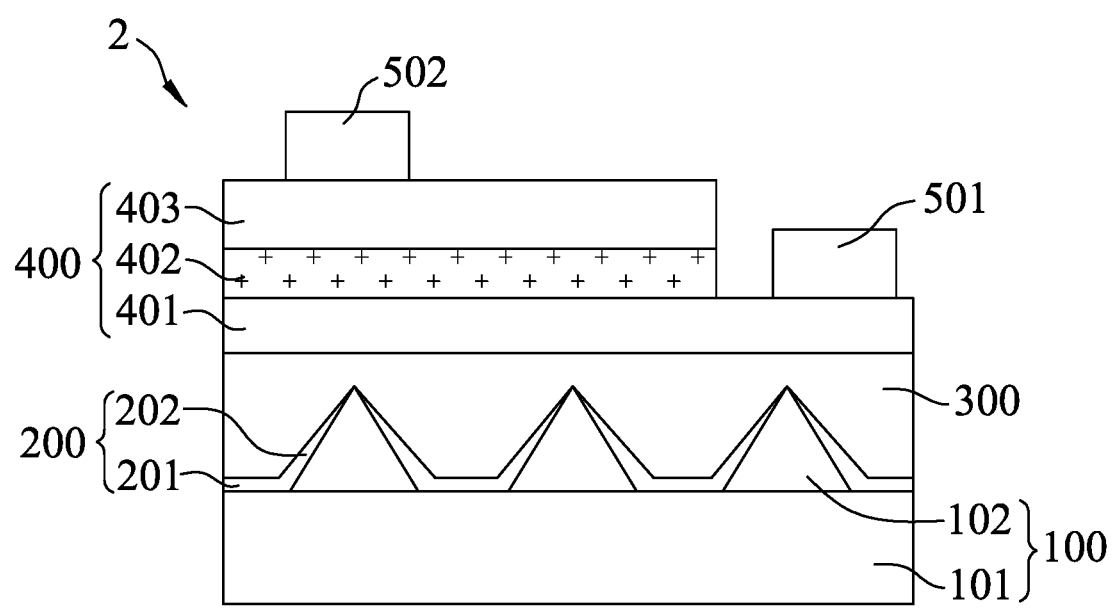
FIG. 6 is a schematic view illustrating an embodiment of a light emitting diode (LED) chip according to the disclosure.

Referring to FIG. 6, an embodiment of an LED chip 2 is illustrated. The LED chip 2 includes the epitaxial substrate structure 1 of FIG. 1 and an epitaxial layered structure 400 which includes a first semiconductor layer 401, an active layer 402 and a second semiconductor layer 403, which are disposed on the buffer layer 200 in such order. The first semiconductor layer 401 has a conductivity type opposite to that of the second semiconductor layer 403. In one example, an undoped layer 300 may be disposed between the buffer layer 200 and the epitaxial layered structure 400.

In one example, the LED chip 2 further includes a first electrode 501 connected to the first semiconductor layer 401 and a second electrode 502 connected to the second semiconductor layer 403. To be specific, the first electrode 501 is formed on a portion of the first semiconductor layer 401 exposed from the active layer 402, and the second electrode 502 is formed on the second semiconductor layer 403.

In this embodiment, the epitaxial layered structure 400 is a GaN-based structure, the undoped layer 300 is made of undoped GaN, and as mentioned above, the buffer layer 200 is made of AlN. The first semiconductor layer 401 is made of one of n-type GaN and p-type GaN and the second semiconductor layer 403 is made of the other one of the n-type GaN and p-type GaN.

Figure 7:
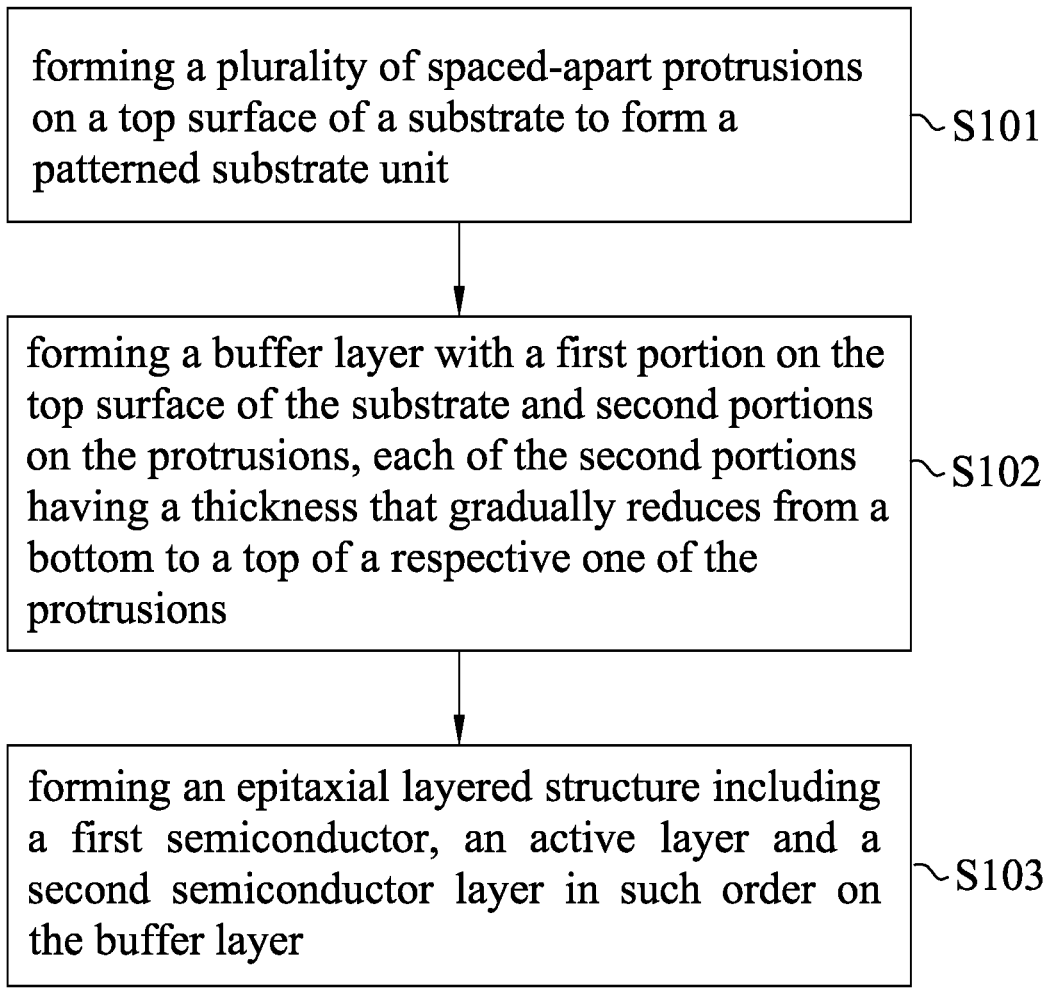
FIG. 7 is a flow chart illustrating a method of manufacturing the embodiment of the LED chip of FIG. 6.

Referring to FIG. 7, a flow chart illustrating an embodiment of a method for manufacturing the LED chip 2 of FIG. 6 is shown. The method includes step S103 in addition to the above mentioned steps S101 and S102. In step S103, the epitaxial layered structure 400 is formed on the buffer layer 200 and includes the first semiconductor layer 401, the active layer 402 and the second semiconductor layer 403 formed in such order. In this embodiment, the epitaxial layered structure 400 may be formed by PVD or chemical vapor deposition (CVD). Then, the first electrode 501 and the second electrode 502 are formed on the epitaxial layered structure 400 by evaporation or sputtering. To be specific, the first electrode 501 formed on the exposed portion of the first semiconductor layer 401 makes an electrical connection therebetween. Similarly, the second electrode 502 formed on the second semiconductor layer 403 makes an electrical connection therebetween.

In one example, before forming the epitaxial layered structure 400 on the buffer layer 200, the undoped layer 300 may be formed between the buffer layer 200 and the epitaxial layered structure 400. The undoped layer 300 may be formed by PVD or CVD.

To sum up, by virtue of the structural design of the epitaxial substrate structure 1 and the method for manufacturing the same according to the disclosure, the reduction of strain between the buffer layer 200 and the epitaxial layered structure 400 may be achieved. That is, making the thickness of each of the second portions 202 of the buffer layer 200 gradually reduce along a respective one of the protrusions 102 from the bottom 1021 to the top 1022, warpage of the epitaxial layered structure 400 can be prevented and the wavelength uniformity of the LED chip 2 including the epitaxial substrate structure 1 can be improved. In addition, with the control of the thickness of the first and second portions 201, 202 of the buffer layer 200, occurrences of lattice mismatch in the epitaxial layered structure 400 can be prevented so that the quality, luminous intensity, and reliability of the LED chip 2 including the epitaxial substrate structure 1 may be increased.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. An epitaxial substrate structure for a light emitting diode chip, comprising:
   a patterned substrate unit including a substrate having a top surface, and a plurality of spaced-apart protrusions formed on said top surface of said substrate to expose a portion of said top surface from said protrusions, each of said protrusions having a bottom adjacent to said top surface of said substrate and a top opposite to said bottom and away from said substrate; and a buffer layer disposed on said patterned substrate unit and having a first portion that is disposed on said exposed portion of said top surface of said substrate and that has an upper surface opposite to said exposed portion, and a plurality of spaced-apart second portions that respectively cover said protrusions and that protrude from said upper surface of said first portion, wherein each of said second portions of said buffer layer has a thickness that gradually reduces from said bottom to said top of the respective one of said protrusions.

2. The epitaxial substrate structure of claim 1, wherein said first portion of said buffer layer has a thickness ranging from 10 Å to 2000 Å, and the thickness of each of said second portions of said buffer layer is greater than 0 Å and smaller than 2000 Å.

3. The epitaxial substrate structure of claim 1, wherein each of said protrusions tapers from said bottom to said top.

4. The epitaxial substrate structure of claim 1, wherein said substrate is made of a material selected from the group consisting of sapphire, silicon carbide (SiC), silicon (Si) and zinc oxide (ZnO).

5. The epitaxial substrate structure of claim 1, wherein each of said protrusions is made of a material selected from the group consisting of sapphire, silicon carbide (SIC), silicon (Si), zinc oxide (ZnO), silicon dioxide ($SiO_2$), silicon nitride (SiN), silicon monoxide (SiO) and combinations thereof.

6. The epitaxial substrate structure of claim 1, wherein said buffer layer is made of aluminum nitride (AlN).

7. A light emitting diode chip, comprising:
an epitaxial substrate structure of claim 1; and
an epitaxial layered structure including a first semiconductor layer, an active layer and a second semiconductor layer which are disposed on said buffer layer in such order.

* * * * *